United States Patent
Grondahl et al.

(10) Patent No.: US 8,907,745 B2
(45) Date of Patent: Dec. 9, 2014

(54) TRANSISTOR SWITCHES WITH SINGLE-POLARITY CONTROL VOLTAGE

(75) Inventors: Christopher D. Grondahl, Gilbert, AZ (US); Donald E. Crockett, III, Mesa, AZ (US)

(73) Assignee: ViaSat, Inc., Carlsbad, CA (US)

( * ) Notice: Subject to any disclaimer, the term of this patent is extended or adjusted under 35 U.S.C. 154(b) by 702 days.

(21) Appl. No.: 13/187,195

(22) Filed: Jul. 20, 2011

(65) Prior Publication Data
US 2013/0021111 A1 Jan. 24, 2013

(51) Int. Cl.
*H01P 1/18* (2006.01)
*H01P 1/15* (2006.01)
*H03H 11/20* (2006.01)

(52) U.S. Cl.
CPC .. *H01P 1/18* (2013.01); *H01P 1/15* (2013.01); *H03H 11/20* (2013.01)
USPC ............ 333/164; 333/103; 333/139; 333/262

(58) Field of Classification Search
CPC ........... H03H 7/18; H03H 7/20; H03H 11/16; H03H 11/20; H01P 1/18; H01P 9/00; H01P 1/15
USPC .................................. 333/103, 139, 164, 262
See application file for complete search history.

(56) References Cited

U.S. PATENT DOCUMENTS 6,137,377 A * 10/2000 Wallace et al. ............... 333/139

* cited by examiner

*Primary Examiner* — Benny Lee
*Assistant Examiner* — Rakesh Patel
(74) *Attorney, Agent, or Firm* — Snell & Wilmer L.L.P.

(57) ABSTRACT

Contrary to phase shifters which require complimentary polarity control voltages, a phase shifter may be driven with a single polarity control voltage. The phase shifter comprises an input node in communication with both a high pass network and a low pass network which are both in communication with an output node, where the phase shifter further comprises a first single pole double throw switch and a second single pole double throw switch configured to selectively pass an RF signal from the input node to the output node by way of one of said high pass network and said low pass network. Furthermore, the first and second single pole double throw switches are configured to select between the high pass network and the low pass network based on a single control signal having a voltage greater than or less than a reference voltage.

19 Claims, 4 Drawing Sheets

TRANSISTOR SWITCHES WITH SINGLE-POLARITY CONTROL VOLTAGE

FIELD OF INVENTION

The invention relates to a system and method for transistor switches using a single-polarity control voltage.

BACKGROUND OF THE INVENTION

In a typical FET switch, control voltages with complimentary polarity had to either be supplied to, or generated by, a circuit employing the FET switch. If the typical FET switch is on a monolithic microwave integrated circuit (MMIC), the complimentary voltages are supplied to the MMIC or generated on the MMIC. If supplied to the MMIC, then twice as many control interfaces are required; one for each control voltage and one for its compliment. If generated on the MMIC, then a foundry process with both enhancement and depletion mode FETs is required or RTL logic must be used. If enhancement and depletion mode is used, then this limits the foundry process selection, which can lead to a severe compromise in RF performance. Additionally, employing RTL logic dissipates DC power. Therefore, it would be desirable to control a FET switch and/or phase-shifter using a single polarity control voltage in order to eliminate the complimentary voltages and associated drawbacks.

One particular type of application employing FET switches are phase shifter circuits, which allow control of insertion phase of a network. They find application in electronic circuitry, such as for example, for shifting the phase of signals propagating on a transmission line. Additionally, phase-shifters on a MMIC typically are designed with switches that require control voltages with complimentary polarity. However, the use of complimentary polarity control voltages adds complexity and the need to provide complimentary voltages to the circuit.

FIG. 1 illustrates a prior art embodiment of a phase-shifter with single pole double throw (SPDT) switches having complimentary control voltages Vcntl and Vcntl*. Furthermore, a reference voltage Vref is used. As shown, the prior art phase-shifter includes both series transistors and shunt transistors. Specifically, phase shifter 100 comprises a first SPDT switch using FETs 106, 108, 110, 112 and a second SPDT switch using FETs 114, 116, 118, 120. In phase shifter 100, control voltage Vcntl is provided to the gate of FETs 106, 110, 114, 118, and complimentary control voltage Vcntl* is provided to the gate of FETs 108, 112, 116, and 120. Moreover, reference voltage Vref is provided to the source-drain terminals of all the FETs.

SUMMARY OF THE INVENTION

The present application addresses problems inherent in the prior art, by providing a FET switch with a single polarity control voltage. Contrary to prior art FET switches which require complimentary polarity control voltages, the FET switch of the exemplary embodiments may be driven with a single polarity control voltage. An exemplary FET switch is controlled by a single polarity control voltage and eliminates the use of complimentary polarity control voltages.

As described herein, complimentary control voltages may be eliminated by designing some of the FETs of the switch to be controlled by applying control voltage to the gate while other FETs are controlled by applying the control voltage to the source-drain terminals. Furthermore, a reference voltage may be applied to the gate of the FETs controlled by the source-drain terminals, or the reference voltage is applied to the source-drain terminals of the FETs controlled by the gate. In an exemplary embodiment, the reference voltage may be positive voltage, negative voltage, or zero depending on the control voltage and the type of FET used in the switch.

In an exemplary embodiment, a phase shifter comprises an input node in communication with both a high pass network and a low pass network which are both in communication with an output node, where the phase shifter further comprises a first single pole double throw switch and a second single pole double throw switch configured to selectively pass an RF signal from the input node to the output node by way of one of said high pass network and said low pass network. Furthermore, the first and second single pole double throw switches are configured to select between the high pass network and the low pass network based on a single control signal having a voltage greater than or less than a reference voltage.

BRIEF DESCRIPTION OF THE DRAWINGS

The accompanying drawings, wherein like numerals depict like elements, illustrate exemplary embodiments of the present invention, and together with the description, serve to explain the principles of the invention. In the drawings.

DETAILED DESCRIPTION

The invention provides a phase shifter with single-polarity control voltage that is useful with all integrated circuits implementing a transistor switch communicating a radio frequency signal. The transistor switch may be constructed using a semi-conductor chip such as a MIMIC. The transistor switch according to the present invention comprises transistors used as switching elements. The transistors may be FETs or BJTs. One application of transistor switches is phase shifters. However, the present invention is not limited to phase shifters but may be expanded to other types of switches. As such, one versed in the art understands that the phase shifter is not limited to the embodiment depicted and that the embodiment described is done to facilitate understanding of the invention.

In accordance with an exemplary embodiment, a single-pole double-throw (SPDT) switch and/or a phase shifter implementing SPDT switches may be controlled with single-polarity control voltages. The complimentary voltages of a typical phase shifter may be eliminated if some of the FETs of the switch are controlled by applying control voltage to the gate while others are controlled by applying the control voltage to the source-drain terminals. Furthermore, in the exemplary embodiment, a reference voltage is applied to the gate of the FETs controlled by the source-drain terminals, or the reference voltage is applied to the source-drain terminals of the FETs controlled by the gate. In an exemplary embodiment, the reference voltage may be positive voltage, negative voltage, or zero depending on the control voltage and the type of FET used in the switch.

The control voltage is dynamically changed to facilitate the switching action of the FET switches. The value of a control voltage Vcntl changes between two settings, namely control voltage Vcntl being sufficiently negative or sufficiently positive relative to a reference voltage Vref and a DC ground to control the transistor state as desired. The specific values of control voltage Vcntl are adjustable and important in the relationship to reference voltage Vref and DC ground. In accordance with exemplary embodiments, only one voltage control path is present in the circuit. In the exemplary embodiment, a second control path (and corresponding control voltage) is not present on the circuit.

Figure 1:
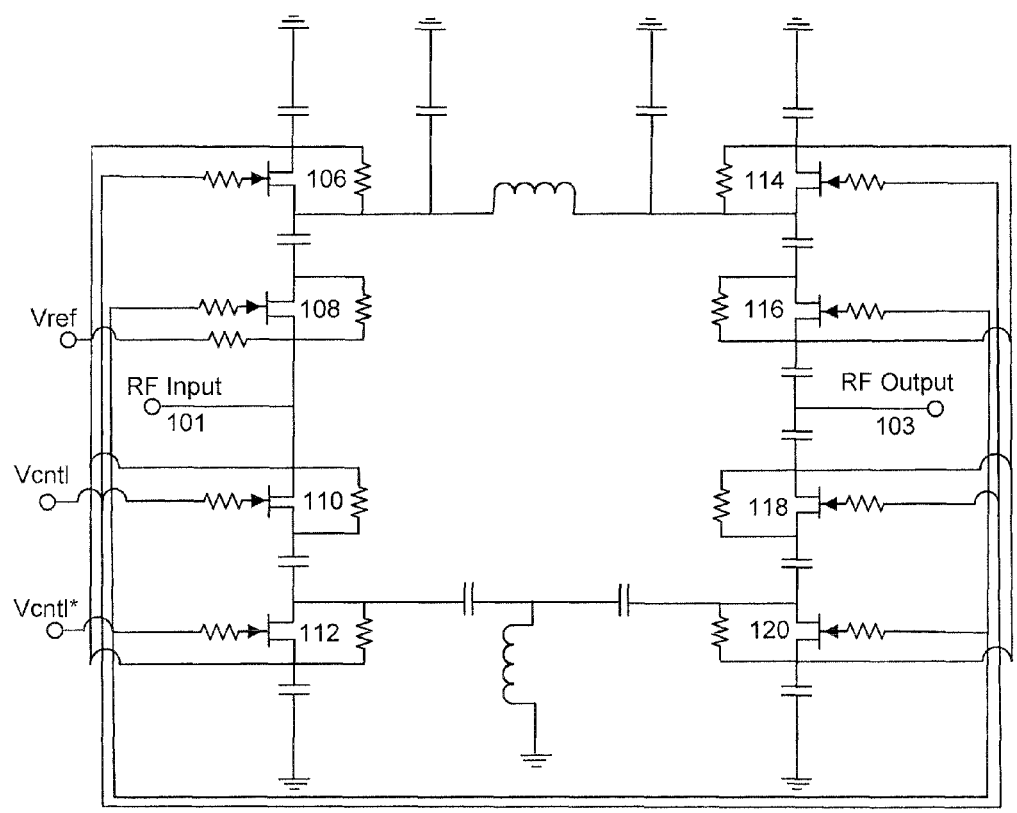
FIG. 1 illustrates a prior art phase-shifter with SPDT transistor switches with complimentary control voltages.
Figure 2:
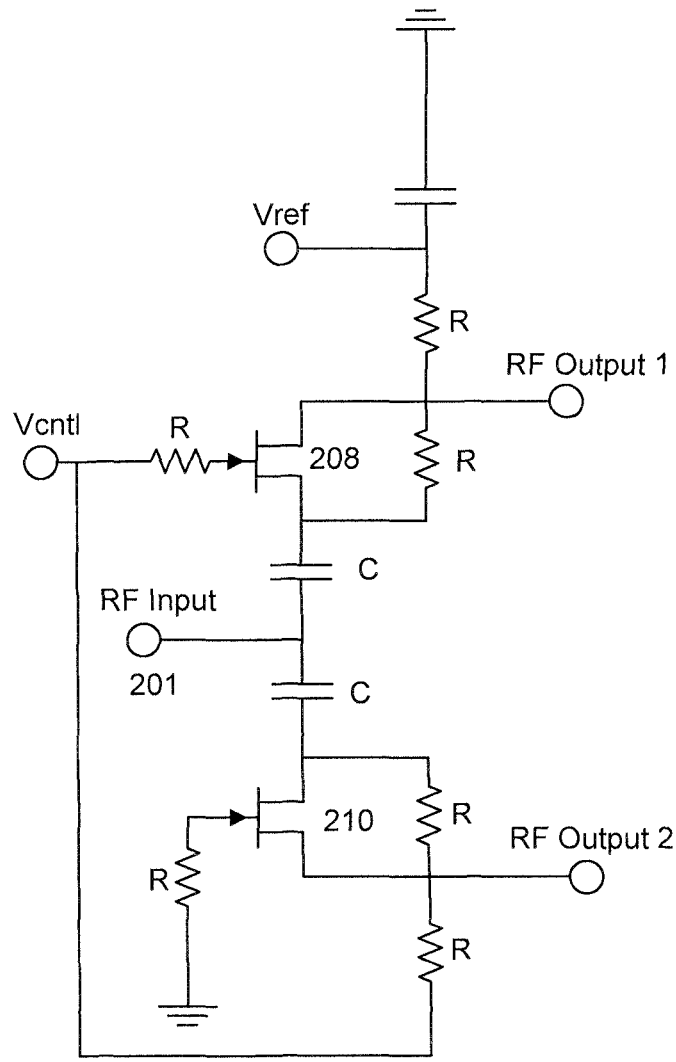
FIG. 2 illustrates an exemplary SPDT switch with series FETs and only one polarity control voltage.

In an exemplary embodiment and with reference to FIG. 2, a SPDT switch 200 includes series FETs and only one polarity control voltage. SPDT switch 200 comprises a first FET 208 and a second FET 210. First FET 208 is controlled with the gate and the second FET 210 is controlled with the source-drain, and by applying the proper control voltage. A control voltage Vcntl is supplied to the gate of first FET 208 and a reference voltage Vref is supplied to the drain and source terminals of first FET 208. Furthermore, a DC ground is supplied to the gate of second FET 210 and Vcntl is supplied to the drain and source terminals of second FET 210.

A radio frequency (RF) signal provided at node 201 is connected to Vref and Vcntl through resistors R and DC blocking capacitors C, which insures that Vref is applied to the drain terminal at FET 208 and that Vcntl is applied to the drain terminal at FET 210 so that the FETs in series with the RF path within the SPDT switch are configured properly.

During exemplary operation the RF signal is provided to node 201 and routed to either RF Output 1 or RF Output 2. In order to route to RF Output 1, first FET 208 is turned on and second FET 210 is turned off. These FETs are turned on and off by setting the control signal Vcntl to the appropriate voltage. In an exemplary embodiment, if the transistors happen to be n-channel depletion mode FETs, then Vcntl is set to be sufficiently more positive than Vref to turn on first FET 208. Correspondingly, Vcntl is sufficiently more positive than DC ground to turn off second FET 210.

Similarly, in order to route the RF signal from node 201 to RF Output 2, first FET 208 is turned off and second FET 210 is turned on. In an exemplary embodiment, if the transistors happen to be n-channel depletion mode FETs, then Vcntl is set to be sufficiently more negative than Vref to turn off FET 208. Correspondingly, Vcntl is sufficiently more negative than DC ground to turn on FET 210.

Figure 3:
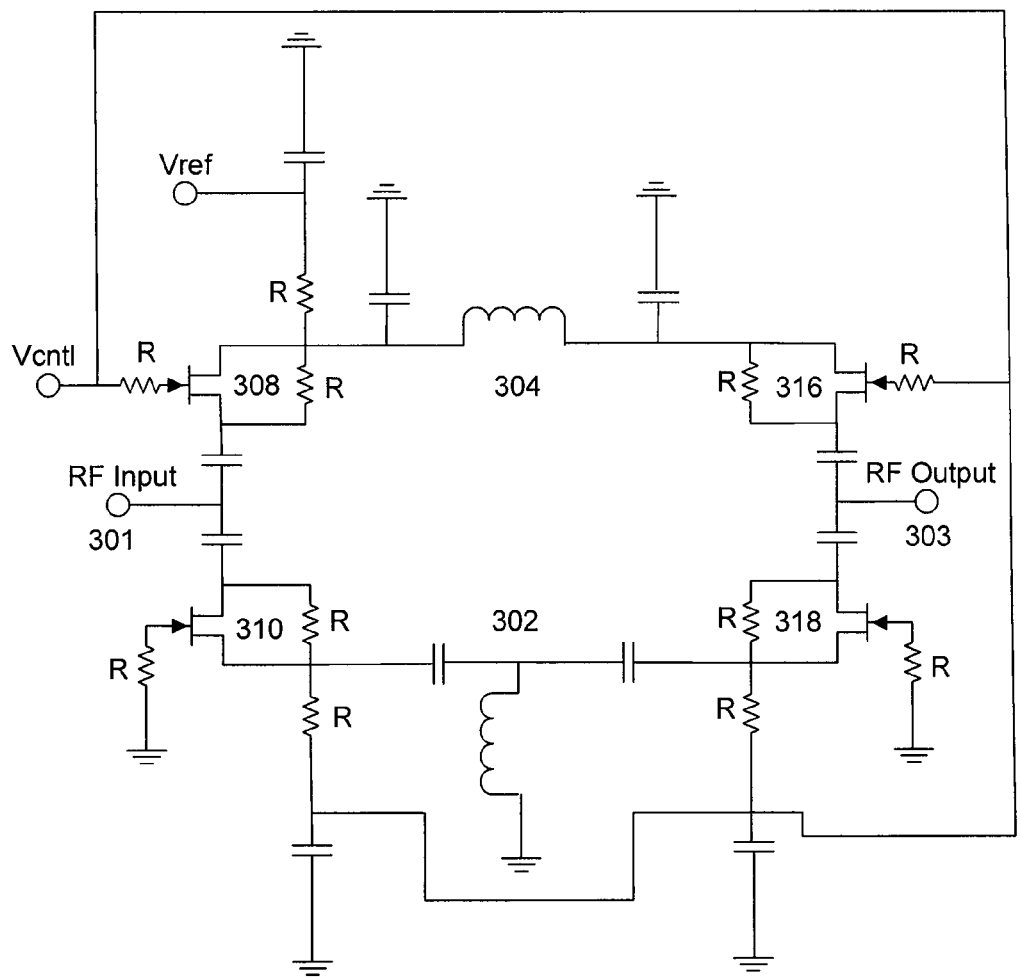
FIG. 3 illustrates an exemplary phase-shifter implementation using SPDT switches with series FETs.

By way of specific example, FET switches are commonly employed in phase shifters. Although embodiments of phase shifters are disclosed, this application is not limited to phase shifters but includes any type of transistor switch, such as an attenuator, transmit/receive switch or any other radio frequency switch. With reference to FIG. 3, an exemplary embodiment of a phase-shifter 300 uses SPDT switches that use only series FETs. Phase shifter 300 comprises a first SPDT switch having FETs 308 and 310 and a second SPDT switch having FETs 316 and 318. The SPDT switches may route an RF input signal 301 through either a high pass network 302 or a low pass network 304.

As noted, the phase shifter 300 may be constructed using FETs 308, 310, 316, and 318, wherein FETs 308, 310 comprise a first SPDT switch and FETs 316, 318 comprise a second SPDT switch. FETs 308, 310 may be substantially similar in construction and FETs 316, 318 may be substantially similar in construction. Moreover, FETs 308, 310, 316, and 318 may be depletion mode FETs, which are selected in accordance with required insertion loss and isolation. Further still, FETs 308, 310, 316, and 318 may be any transistors capable of use as a switch.

Some of the FETs are controlled with the gate and other FETs are controlled with source-drain and by applying the proper control voltages given the set reference voltage. FETs 308 and 316 have Vcntl provided to the gate of the respective transistor, while Vref is provided to the source and drain terminals of FETs 308 and 316. Furthermore, FETs 310 and 318 have DC ground provided to the gate of the respective transistor, while Vcntl is provided to the source and drain terminals of FETs 310 and 318. These DC grounds are not connected directly to ground, but instead are connected to ground through a resistor R for isolation. Also, the Vcntl and Vref voltages may not directly be connected to the FET terminals, but instead may be connected via a resistor R. In various embodiments, the plurality of resistors R have the same value, which may increase isolation without additional space issues. In one example, the resistor R has a value of 200 Ohms.

A high pass network 302 is connected to the first SPDT switch at the source of FET 310 and to the second SPDT switch at the source of FET 318. A low pass network 304 is connected to the first SPDT switch at the source of FET 308 and to the second SPDT switch at the source of FET 316. As such, when a RF signal is injected into phase shifter 300 at node 301, the SPDT switches route the RF signal through the low pass network 304 or high pass network 302. The difference in phase shifting of the low pass network 304 and the high pass network 302 leads to a phase shifting of the RF signal as desired. Consequently, the configuration of the low pass network 304 and the high pass network 302 are chosen according to the amount of phase shift desired for the phase shifter bit and the matching impedance of the phase shifter bit.

During exemplary operation, a RF signal is provided to node 301. In one of the two possible phase states the RF signal is routed through the high pass network 302. The first SPDT switch is set to have low loss between node 301 and the high pass network 302 and to have high isolation between node 301 and the low pass network 304. The second SPDT switch is set to have low loss between the high pass network 302 and node 303 and have high isolation between the low pass network 304 and node 303. This switch condition is established by turning off FET 308 and FET 316 and turning on FET 310 and FET 318. These FETs are turned on and off by setting the signal Vcntl to the appropriate voltage. If the transistors happen to be n-channel depletion mode FETs, then Vcntl is set to be sufficiently more negative than Vref to turn off FET 308 and FET 316. Correspondingly, Vcntl is sufficiently more negative than DC ground to turn on FET 310 and FET 318. In operation, assuming the value of Vcntl is sufficiently negative as described, if Vcntl is provided to the gate of the FET, then the FET is turned off. If Vcntl is provided to the source and drain of the FET, then the FET is turned on. The RF signal is routed through the high pass network 302 by the first SPDT switch. The second SPDT switch then receives the RF signal from the high pass network 302 and routes it to node 303.

In the other of the two possible phase states, the RF signal is routed through the low pass network 304. The first SPDT switch is set to have low loss between node 301 and the low pass network 304 and to have high isolation between node 301 and the high pass network 302. The second SPDT switch is set to have low loss between the low pass network 304 and node 303 and have high isolation between the high pass network 302 and node 303. This switch condition is established by turning on FET 308 and FET 316 and turning off FET 310 and FET 318. These FETs are turned on and off by setting the signal Vcntl to the appropriate voltage. Again, if the transistors happen to be n-channel depletion mode FETs, then Vcntl is set to be equal to or slightly more positive than Vref to turn on FET 308 and FET 316. Correspondingly, Vcntl is sufficiently more positive than DC ground to turn off FET 310 and FET 318. In operation, assuming the value of Vcntl is sufficiently positive as described, if Vcntl is provided to the gate of the FET, then the FET is turned on. If Vcntl is provided to the source and drain of the FET, then the FET is turned off. The RF signal is routed to the low pass network 304 by the first SPDT switch. The second SPDT switch then receives the RF signal from the low pass network 304 and routes it to node 303.

Figure 4:
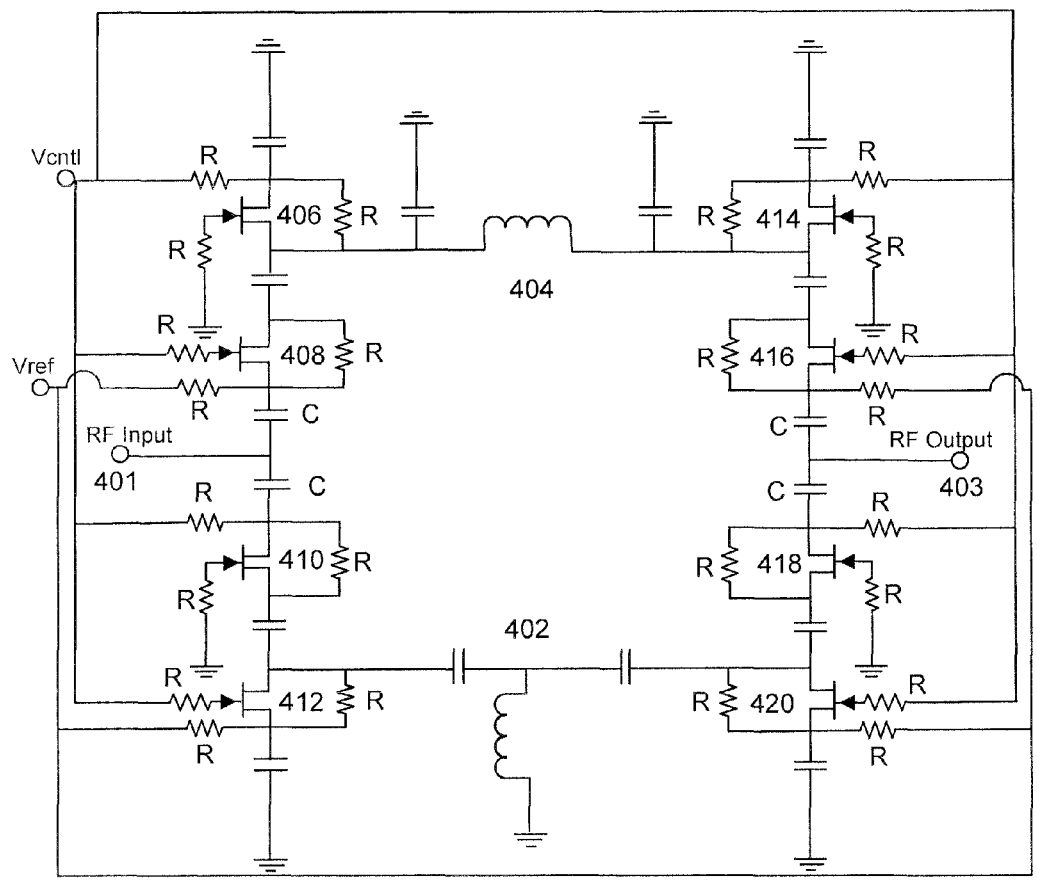
FIG. 4 illustrates another exemplary phase-shifter implementation using SPDT switches with both series and shunt FETs.

In an exemplary embodiment and with reference to FIG. 4, a phase shifter 400 with single polarity control voltage is illustrated. As shown, phase shifter 400 comprises two SPDT switches comprising FETs. The SPDT switches may route an RF input signal to either a high pass network 402 or a low pass network 404. Furthermore, phase shifter 400 comprises SPDT switches implementing both series and shunt FETs. Some of the FETs are controlled with the gate and other FETs are controlled with source-drain and by applying the proper reference and control voltages. Furthermore, DC blocking capacitors are used to isolate both the reference voltage and the control voltage.

As noted, the phase shifter 400 may be constructed using FETs 406, 408, 410, 412, 414, 416, 418 and 420, wherein FETs 406, 408, 410 and 412 comprise a first SPDT switch and FETs 414, 416, 418, 420 comprise a second SPDT switch. FETs 406, 408, 410 and 412 may be substantially similar in construction and FETs 414, 416, 418, 420 may be substantially similar in construction. Moreover, FETs 406, 408, 410, 412, 414, 416, 418 and 420 may be depletion mode FETs, which are selected in accordance with required insertion loss and isolation. Further still, FETs 406, 408, 410, 412, 414, 416, 418 and 420 may be any transistors capable of use as a switch.

A control voltage Vcntl is provided to the first SPDT switch at the gate of transistors 408 and 412. Control voltage Vcntl is provided to the source and drain of transistors 406 and 410. Similarly, control voltage Vcntl is provided to the second SPDT switch at the gate of transistors 416 and 420. Control voltage Vcntl is also provided to the source and drain of transistors 414 and 418.

A reference voltage Vref is provided to the first SPDT switch at the source and drain of transistors 408 and 412. Similarly, reference voltage Vref is provided to the second SPDT switch at the source and drain of transistors 416 and 420. Moreover, a DC ground is provided to the gate of FETs 406, 410, 414, and 418. These DC grounds are not connected directly to ground, but instead are connected to ground through a resistor R for isolation.

Vref and Vcntl are provided to the first and second SPDT switches through resistors R. In this aspect of the invention, resistors R isolate the RF signals provided at nodes 401 and 403 from the Vref and control voltage Vcntl. Similarly, the RF signals provided at nodes 401 and 403 are connected to Vref and Vcntl through resistors R and DC blocking capacitors C, which insures that Vref is applied to the drain terminals at FETs 408 and 416 and that Vcntl is applied to the drain terminals at FETs 410 and 418 so that the FETs in series with the RF path within the first and second SPDT switch properly.

Capacitor C is a series resonant capacitor that provides a low impedance RF path to ground so that RF performance of the phase shifter 400 is not degraded. The values of capacitors C are chosen according to values needed to achieve series resonance with the inductance to ground at the design frequency. The values of resistors R are chosen according to values needed to achieve adequate isolation between the RF signal and the dc signals. If there is not enough isolation between the RF signal and the dc signals then the RF performance can be degraded. Although the invention is not so limited, an exemplary R value may be approximately between 1 to 2 kΩ.

A high pass network 402 is connected to the first SPDT switch at the drain of FET 412 and to the second SPDT switch at the drain of FET 420. A low pass network 404 is connected to the first SPDT switch at the drain of FET 406 and to the second SPDT switch at the drain of FET 414. As such, when a RF signal is injected into phase shifter 400 at node 401, the SPDT switches route the RF signal through the low pass network 404 or high pass network 402. The difference in phase shifting of the low pass network 404 and the high pass network 402 leads to a phase shifting of the RF signal as desired. Consequently, the configuration of the low pass network 404 and the high pass network 402 are chosen according to the amount of phase shift desired for the phase shifter bit and the matching impedance of the phase shifter bit.

During exemplary operation a RF signal is provided to node 401. In one of the two possible phase states the RF signal is routed through the high pass network 402. The first SPDT switch is set to have low loss between node 401 and the high pass network 402 and to have high isolation between node 401 and the low pass network 404. The second SPDT switch is set to have low loss between the high pass network 402 and node 403 and have high isolation between the low pass network 404 and node 403. This switch condition is established by turning off FET 408, FET 412, FET 416 and FET 420 and turning on FET 406, FET 410, FET 414 and FET 418. These FETs are turned on and off by setting the signal Vcntl to the appropriate voltage. If the transistors happen to be n-channel depletion mode FETs, then Vcntl is set to be sufficiently more negative than Vref to turn off FET 408, FET 412, FET 416 and FET 420. Correspondingly, Vcntl is sufficiently more negative than DC ground to turn on FET 406, FET 410, FET 414, and FET 418. In operation, assuming the value of Vcntl is sufficiently negative as described, if Vcntl is provided to the gate of the FET, then the FET is turned off. If Vcntl is provided to the source and drain of the FET, then the FET is turned on. The RF signal is routed to the high pass network 402 by the first SPDT switch. The second SPDT switch then receives the RF signal from the high pass network 402 and routes it to node 403.

In the other of the two possible phase states the RF signal is routed through the low pass network 404. The first SPDT switch is set to have low loss between node 401 and the low pass network 404 and to have high isolation between node 401 and the high pass network 402. The second SPDT switch is set to have low loss between the low pass network 404 and node 403 and have high isolation between the high pass network 402 and node 403. This switch condition is established by turning on FET 408, FET 412, FET 416 and FET 420 and turning off FET 406, FET 410, FET 414 and FET 418. These FETs are turned on and off by setting the signal Vcntl to the appropriate voltage. Again, if the transistors happen to be n-channel depletion mode FETs, then Vcntl is set to be equal to or slightly more positive than Vref to turn on FET 408, FET 412, FET 416 and FET 420. Correspondingly, Vcntl is sufficiently more positive than DC ground to turn off FET 406, FET 410, FET 414, and FET 418. In operation, assuming the value of Vcntl is sufficiently positive as described, if Vcntl is provided to the gate of the FET, then the FET is turned on. If Vcntl is provided to the source and drain of the FET, then the FET is turned off. The RF signal is routed to the low pass network 404 by the first SPDT switch. The second SPDT switch then receives the RF signal from the low pass network 404 and routes it to node 403.

Notably, although the present invention is described with respect to FETs and phase shifters, the invention is not so limited. The invention also contemplates integrated circuits comprising SPDT switches and the transistors may include bipolar junction transistors (BJT).

A conventional phase shifter network comprises several bits. As such, the phase shifter topology of the present invention may be one of the several bits of a phase shifter network. Other bits in the phase shifter network may have a different topology than the topology described herein. FIGS. 3 and 4 illustrate two examples of phase shifter bit topologies. The topologies in FIGS. 3 and 4 illustrate that a phase bit may have different numbers of transistors. FIG. 3 illustrates a phase bit with 4 transistors forming two SPDT switches. FIG. 4 illustrates a phase bit with 8 transistors, including shunt FETs, forming two SPDT switches. Higher order phase bits usually include more transistors than do lower order phase bits. FIG. 4 with 8 transistors is a typical topology for higher order bits. The inventive concepts of the phase shifter described below apply to all phase shifter networks regardless of the topology used.

The present invention has been described above with reference to various exemplary embodiments. However, those skilled in the art will recognize that changes and modifications may be made to the exemplary embodiments without departing from the scope of the present invention. For example, the various operational steps, as well as the components for carrying out the operational steps, may be implemented in alternate ways depending upon the particular application or in consideration of any number of cost functions associated with the operation of the system (e.g., various of the steps may be deleted, modified, or combined with other steps). Alternatively, additional steps (e.g., including additional electrical components) may be added to illustrate alternate embodiments of the invention. In addition, the various circuit component systems disclosed herein may be modified or changed to accommodate additional transistor switch circuit components as may be desired. The changes and/or modifications described above are intended to be included within the scope of the present disclosure, as set forth in the following claims.

What is claimed is:

1. A phase shifter comprising:
a first single pole double throw switch for receiving a radio frequency (RF) signal at an input node, a voltage reference signal, and a single control signal, said first single pole double throw switch for providing said RF signal to one of a high pass network or a low pass network, wherein said first single pole double throw switch comprises a first transistor and a second transistor; and
a second single pole double throw switch for receiving said voltage reference signal, said second single pole double throw switch for receiving said RF signal from said high pass network or said low pass network and providing said RF signal to an output node,
wherein said first single pole double throw switch provides said RF signal from said input node to one of said high pass network or said low pass network in accordance with said single control signal and wherein said second single pole double throw switch provides said RF signal from one of said high pass network or said low pass network to said output node in accordance with said single control signal;

wherein said voltage reference signal is provided to a source terminal and a drain terminal of said first transistor, wherein said single control signal is provided to a gate of said first transistor; and wherein said single control signal is provided to a source terminal and a drain terminal of said second transistor.

2. The phase shifter of claim 1, wherein the drain terminal of said first transistor is in communication with the drain terminal of said second transistor at a first common node for receiving said RF signal from said input node, wherein a DC ground is connected to a gate of said second transistor, and wherein said first single pole double throw switch further comprises:
a third transistor in communication with said first transistor, wherein said single control signal is provided to a source terminal and a drain terminal of said third transistor, and wherein the DC ground is provided to a gate of the third transistor, and wherein the drain terminal of said third transistor is connected to the source terminal of said first transistor via a first capacitor, said first capacitor configured to isolate the single control signal at the drain terminal of said third transistor from the voltage reference signal at the source terminal of the first transistor; and
a fourth transistor in communication with said second transistor, wherein said voltage reference signal is provided to a source terminal and a drain terminal of the fourth transistor, and wherein said single control signal is provided to a gate of said fourth transistor, and wherein the source terminal of said second transistor is connected to the drain terminal of said fourth transistor via a second capacitor, said second capacitor configured to isolate said single control signal at the source terminal of said second transistor from said voltage reference signal at the drain terminal of said fourth transistor.

3. The phase shifter of claim 2, wherein said second single pole double throw switch further comprises:
a fifth transistor and a sixth transistor, wherein a drain terminal of said fifth transistor is in communication with a drain terminal of said sixth transistor at a second common node that is configured to receive said RF signal at said output node;
wherein a gate of said fifth transistor is provided said single control signal, and wherein said voltage reference signal is provided to a source terminal and the drain terminal of said fifth transistor;
wherein a gate of the sixth transistor is provided the DC ground, and wherein said single control signal is provided to a source terminal and the drain terminal of said sixth transistor;
a seventh transistor in communication with said fifth transistor, wherein said single control signal is provided to a source terminal and a drain terminal of said seventh transistor, and wherein a DC ground is provided to a gate of the seventh transistor, and wherein the drain terminal of said seventh transistor is connected to the source terminal of said fifth transistor via a third capacitor, said third capacitor configured to isolate the single control signal of the drain terminal of said seventh transistor from the voltage reference signal at the source terminal of the fifth transistor; and
an eighth transistor in communication with said sixth transistor, wherein said voltage reference signal is provided to a source terminal and a drain terminal of said eighth transistor, wherein said single control signal is provided to a gate of said eighth transistor, and wherein the source terminal of said sixth transistor is connected to the drain terminal of said eighth transistor via a fourth capacitor, said fourth capacitor configured to isolate the single control signal at the source terminal of said sixth transistor from said voltage reference signal at said drain terminal of the eighth transistor.

4. The phase shifter of claim 3, wherein said RF signal is routed through said high pass network to said second common node in response to said single control signal being a greater value than said voltage reference signal.

5. The phase shifter of claim 1, wherein said single control signal sets said first single pole double throw switch to connect said input node to said high pass network and to disconnect said input node from said low pass network, and wherein said single control signal sets said second single pole double throw switch to connect said high pass network to said output node and to disconnect said low pass network from said output node.

6. The phase shifter of claim 1, wherein said single control signal sets said first single pole double throw switch to disconnect said input node from said high pass network and to connect said input node to said low pass network, and wherein said single control signal sets said second single pole double throw switch to disconnect said high pass network from said output node and to connect said low pass network to said output node.

7. The phase shifter of claim 2, wherein said RF signal is routed through said low pass network to said output node in response to said single control signal being a lesser value than said voltage reference signal.

8. The phase shifter of claim 1, wherein said single control signal comprises a first state having a first voltage level and a second state having a second voltage level, wherein the first voltage level is relatively higher than the second voltage level, and wherein said single control signal being in the first state causes the RF signal at said input node to be routed through one of said high pass network and said low pass network, and wherein said single control signal being in the second state causes the RF signal at said input node to be routed through the other one of said high pass network and said low pass network.

9. A single pole double throw field-effect transistor (FET) switch comprising:
a first FET in parallel with a second FET, wherein a drain terminal of said first FET is in communication with a drain terminal of said second FET at a first common node for receiving an RF signal at an input node;
wherein a gate of said first FET is provided a single control voltage, and wherein a voltage reference signal is provided to a source terminal and the drain terminal of said first FET; and
wherein a gate of the second FET is provided a DC ground, and wherein said single control voltage is provided to a source terminal and the drain terminal of said second FET.

10. The FET switch of claim 9, wherein said FET switch is employed in an attenuator.

11. The FET switch of claim 9, wherein said FET switch is employed in a transmit/receive switch.

12. The FET switch of claim 9, wherein said FET switch is employed in a phase shifter.

13. A method for phase shifting comprising:
receiving a radio frequency (RF) signal at an input node associated with a first single pole double throw switch, wherein said first single pole double throw switch and a second single pole double throw switch are controlled via a single control signal, and wherein said first single pole double throw switch comprises a first transistor and a second transistor;
biasing both a source terminal and a drain terminal of said first transistor based on a voltage reference signal;
controlling a gate of said first transistor based on said single control signal;
biasing both a source terminal and a drain terminal of said second transistor based on said single control signal;
switching between (1) providing the RF signal from said first single pole double throw switch to said second single pole double throw switch via a high pass network, and (2) providing the RF signal from said first single pole double throw switch to said second single pole double throw switch via a low pass network; and
outputting the RF signal at an output node associated with said second single pole double throw switch.

14. The method for phase shifting of claim 13, wherein a DC ground is connected to a gate of said second transistor.

15. A phase shifter configured to receive a single control signal, a voltage reference signal, and a radio frequency (RF) signal, and to phase shift said RF signal based on said single control signal, said phase shifter comprising:
a high pass network and a low pass network connected between a first single pole double throw switch and a second single pole double throw switch, wherein said first single pole double throw switch comprises a first transistor and a second transistor;
wherein said voltage reference signal is provided to a source terminal and a drain terminal of said first transistor, wherein said single control signal is provided to a gate of said first transistor, and wherein said single control signal is provided to a source terminal and a drain terminal of said second transistor.

16. The phase shifter of claim 15 wherein the phase shift of said RF signal is controlled based on said single control signal having a voltage greater than or less than said voltage reference signal.

17. The phase shifter of claim 15, wherein a DC ground is connected to a gate of said second transistor.

18. A phase shifter comprising:
an input node in communication with both a high pass network and a low pass network which are both in communication with an output node;
wherein said phase shifter further comprises a first single pole double throw switch and a second single pole double throw switch configured to selectively pass an RF signal from said input node to said output node by way of one of said high pass network and said low pass network; and
wherein said first and second single pole double throw switches are configured to select between said high pass network and said low pass network based on a single control signal having a voltage greater than or less than a reference voltage;
wherein said first single pole double throw switch comprises a first transistor and a second transistor, wherein a source terminal and a drain terminal of said first transistor are both biased based on said reference voltage, wherein a source terminal and a drain terminal of said second transistor are biased based on said single control signal, and wherein a gate of said first transistor is controlled based on said single control signal.

19. The phase shifter of claim 18, wherein a gate of said second transistor is biased based on a DC ground.

* * * * *